United States Patent
Hiyoshi et al.

(10) Patent No.: US 9,887,263 B2
(45) Date of Patent: Feb. 6, 2018

(54) SILICON CARBIDE SEMICONDUCTOR DEVICE AND METHOD OF MANUFACTURING THE SAME

(71) Applicant: Sumitomo Electric Industries, Ltd., Osaka-shi (JP)

(72) Inventors: Toru Hiyoshi, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 8 days.

(21) Appl. No.: 14/917,430

(22) PCT Filed: Jul. 16, 2014

(86) PCT No.: PCT/JP2014/068878
§ 371 (c)(1),
(2) Date: Mar. 8, 2016

(87) PCT Pub. No.: WO2015/033673
PCT Pub. Date: Mar. 12, 2015

(65) Prior Publication Data
US 2016/0218176 A1 Jul. 28, 2016

(30) Foreign Application Priority Data

Sep. 9, 2013 (JP) ................................ 2013-186186

(51) Int. Cl.
*H01L 29/15* (2006.01)
*H01L 29/06* (2006.01)
(Continued)

(52) U.S. Cl.
CPC ........ *H01L 29/0649* (2013.01); *H01L 21/046* (2013.01); *H01L 21/3242* (2013.01);
(Continued)

(58) Field of Classification Search
CPC .............. H01L 21/046; H01L 21/3242; H01L 29/1095; H01L 29/1608; H01L 29/66068; H01L 29/7802
See application file for complete search history.

(56) References Cited

U.S. PATENT DOCUMENTS 5,808,352 A 9/1998 Sakamoto
2006/0137600 A1* 6/2006 Ellison ................... C30B 25/00
117/19
(Continued)

FOREIGN PATENT DOCUMENTS

JP H08-227895 A 9/1996
JP 2006-021954 A 1/2006
(Continued)

OTHER PUBLICATIONS

Katsunori Danno, "Investigation of carrier lifetime in 4H-SiC epilayers and lifetime control by electron irradiation", May 17, 2007, Applied Physics Letters, 90.*
(Continued)

*Primary Examiner* — Trung Q Dang
*Assistant Examiner* — Frederick B Hargrove
(74) *Attorney, Agent, or Firm* — Venable LLP; Michael A. Sartori; Miguel A. Lopez

(57) ABSTRACT

An SiC semiconductor device includes an SiC layer including a drift region forming a surface and a body region forming a part of a surface and being in contact with the drift region, a drain electrode electrically connected to a region on a side of the surface in the drift region, and a source electrode electrically connected to the body region. Main carriers which pass through the drift region and migrate between the drain electrode and the source electrode are
(Continued)

only electrons. $Z_{1/2}$ center is introduced into the drift region at a concentration not lower than $1\times10^{13}$ cm$^{-3}$ and not higher than $1\times10^{15}$ cm$^{-3}$.

6 Claims, 10 Drawing Sheets

(51) Int. Cl.
  *H01L 21/04* (2006.01)
  *H01L 21/324* (2006.01)
  *H01L 29/66* (2006.01)
  *H01L 29/16* (2006.01)
  *H01L 29/78* (2006.01)
  *H01L 29/10* (2006.01)

(52) U.S. Cl.
  CPC ...... *H01L 29/1095* (2013.01); *H01L 29/1608* (2013.01); *H01L 29/66068* (2013.01); *H01L 29/7802* (2013.01)

(56) References Cited

U.S. PATENT DOCUMENTS

2011/0175110 A1* 7/2011 Wada .................. H01L 29/045
                                                              257/77
2013/0193447 A1   8/2013 Shimazu et al.
2014/0034966 A1* 2/2014 Nishio ................ H01L 29/1608
                                                              257/77

FOREIGN PATENT DOCUMENTS

| JP | 2009-164440 A | 7/2009 |
| JP | 2010-157593 A | 7/2010 |
| JP | 2011-109018 A | 6/2011 |
| JP | 2013-162118 A | 8/2013 |

OTHER PUBLICATIONS

Skowronski et al., "Degradation of hexagonal silicon-carbide-based bipolar devices," Journal of Applied Physics, Jan. 13, 2006, vol. 99, 01101, pp. 1-24.

Danno, et al., "Investigation of carrier lifetime in 4H—SiC epilayers and lifetime control by electron irradiation," Applied Physics Letters, May 17, 2007, vol. 90, 202109, pp. 1-3.

Kawahara et al., "Depth Profile and Dose Dependency of Deep Levels in Ion-implanted 4H—SiC," Japan Society of Applied Physics and Related Societies, vol. 1, 2009, p. 440.

International Search Report in International Application No. PCT/JP2014/068878, dated Oct. 14, 2014.

\* cited by examiner

SILICON CARBIDE SEMICONDUCTOR DEVICE AND METHOD OF MANUFACTURING THE SAME

TECHNICAL FIELD

The present invention relates to a silicon carbide semiconductor device and a method of manufacturing the same, and more particularly to a silicon carbide semiconductor device capable of achieving suppression of increase in on resistance and a method of manufacturing the same.

BACKGROUND ART

In recent years, in order to achieve a higher breakdown voltage and lower loss of a semiconductor device, silicon carbide has increasingly been adopted as a material for forming a semiconductor device. Silicon carbide is a wide band-gap semiconductor greater in band gap than silicon conventionally widely used as a material for forming a semiconductor device. Therefore, by adopting silicon carbide as a material for forming a semiconductor device, a higher breakdown voltage, a lower on resistance of a semiconductor device and the like can be achieved. In addition, a semiconductor device adopting silicon carbide as a material is also more advantageous than a semiconductor device adopting silicon as a material in that deterioration in its characteristics at the time when it is used in an environment at a high temperature is less.

A semiconductor device containing silicon carbide as a constituent material is exemplified by a metal oxide semiconductor field effect transistor (MOSFET) or a bipolar device such as a diode (see M. Skowronski and S. Ha, "Degradation of hexagonal silicon-carbide-based bipolar devices," Journal of Applied Physics, (United States), AIP Publishing LLC, Jan. 13, 2006, Vol. 99, 011101 (1 to 24) (NPD 1)). The MOSFET is a unipolar device in which migration of one type of carriers between a source electrode and a drain electrode is controlled with a prescribed threshold voltage being defined as the boundary.

CITATION LIST

Non Patent Document

NPD 1: M. Skowronski and S. Ha, "Degradation of hexagonal silicon-carbide-based bipolar devices," Journal of Applied Physics, (United States), AIP Publishing LLC, Jan. 13, 2006, Vol. 99, 011101 (1 to 24)

NPD 2: Katsunori Danno, Daisuke Nakamura, and Tsunenobu Kimoto, "Investigation of carrier lifetime in 4H—SiC epilayers and lifetime control by electron irradiation," Applied Physics Letters, (United States), AIP Publishing LLC, May 17, 2007, Vol. 90, 202109 (1 to 3)

SUMMARY OF INVENTION

Technical Problem

A MOSFET contains a body diode formed as a result of contact between a drift region having an n conductivity type and a body region having a p conductivity type. In this MOSFET containing the body diode, a stacking fault extends in a semiconductor layer during operation, which results in increase in on resistance.

The present invention was made in view of the problem above, and an object thereof is to provide a silicon carbide semiconductor device capable of achieving suppression of increase in on resistance while electrical characteristics thereof are maintained and a method of manufacturing the same.

Solution to Problem

A silicon carbide semiconductor device according to the present invention includes a silicon carbide layer including a first conductivity type region forming one surface and a second conductivity type region forming a part of the other surface opposite to the one surface and being in contact with the first conductivity type region, a first electrode electrically connected to a region on a side of the one surface in the first conductivity type region, and a second electrode electrically connected to the second conductivity type region. In the silicon carbide semiconductor device, main carriers which pass through the first conductivity type region and migrate between the first electrode and the second electrode are only carriers having a first conductivity type. $Z_{1/2}$ center is introduced into the first conductivity type region at a concentration not lower than $1 \times 10^{13}$ cm$^{-3}$ and not higher than $1 \times 10^{15}$ cm$^{-3}$.

A method of manufacturing a silicon carbide semiconductor device according to the present invention includes the steps of forming a silicon carbide layer including a first conductivity type region forming one surface and a second conductivity type region forming a part of the other surface opposite to the one surface and being in contact with the first conductivity type region, introducing $Z_{1/2}$ center into the first conductivity type region at a concentration not lower than $1 \times 10^{13}$ cm$^{-3}$ and not higher than $1 \times 10^{15}$ cm$^{-3}$, forming a first electrode electrically connected to a region on a side of the one surface in the first conductivity type region, and forming a second electrode electrically connected to the second conductivity type region. Main carriers which pass through the first conductivity type region and migrate between the first electrode and the second electrode are only carriers having a first conductivity type.

ADVANTAGEOUS EFFECTS OF INVENTION

According to the silicon carbide semiconductor device and the method of manufacturing the same according to the present invention, a silicon carbide semiconductor device capable of achieving suppression of increase in on resistance while electrical characteristics thereof are maintained and a method of manufacturing the same can be provided.

DESCRIPTION OF EMBODIMENTS

Figure 1:
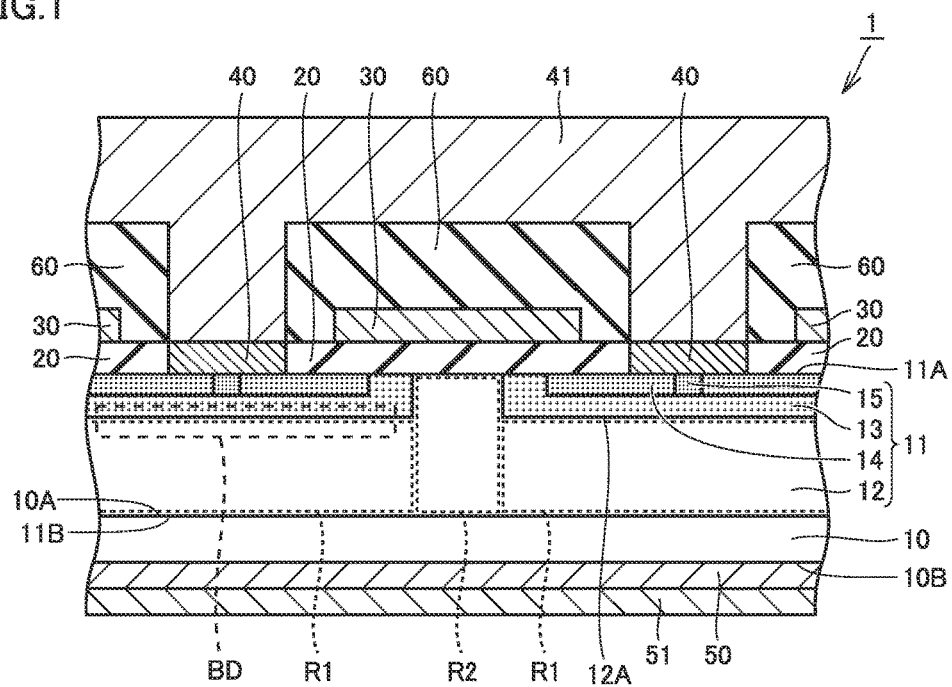
FIG. 1 is a schematic cross-sectional view showing a structure of a silicon carbide semiconductor device according to a first embodiment.

Description of Embodiments of Invention of Present Application

Contents of embodiments of the present invention will initially be listed and described.

(1) A silicon carbide semiconductor device (an SiC semiconductor device 1) according to the present embodiment includes a silicon carbide layer (an SiC layer 11) including a first conductivity type region (a drift region 12) forming one surface (11B) and a second conductivity type region (a body region 13) forming a part of the other surface (11A) opposite to the one surface and being in contact with the first conductivity type region, a first electrode (a drain electrode 50) electrically connected to a region on a side of the one surface in the first conductivity type region, and a second electrode (a source electrode 40) electrically connected to the second conductivity type region. In the silicon carbide semiconductor device, main carriers which pass through the first conductivity type region and migrate between the first electrode and the second electrode are only carriers (electrons) having a first conductivity type. $Z_{1/2}$ center is introduced into the first conductivity type region at a concentration not lower than $1 \times 10^{13}$ cm$^{-3}$ and not higher than $1 \times 10^{15}$ cm$^{-3}$.

The present inventor has conducted dedicated studies about approaches for suppressing increase in on resistance while electrical characteristics of a silicon carbide semiconductor device are maintained. Consequently, the present inventor has obtained findings as below and derived the present invention.

In a silicon carbide semiconductor device containing a body diode formed as a result of contact between a drift region having an n-type and a body region having a p-type, holes are injected from the body region into the drift region and electrons are injected from an electrode into the drift region during operation. Then, the injected electrons and holes are recombined in the drift region. Here, energy released as a result of recombination is given to dislocations (basal plane dislocations) in SiC, and a stacking fault extends in an SiC crystal as originating from the dislocations. Consequently, an on resistance of the SiC semiconductor device increases.

In SiC semiconductor device 1, $Z_{1/2}$ center is introduced into drift region 12 at a concentration not lower than $1 \times 10^{13}$ cm$^{-3}$. Therefore, holes H injected from body region 13 into drift region 12 can be recombined with electrons present within drift region 12 at the $Z_{1/2}$ center before holes reach a region on a side of drain electrode 50 in drift region 12. Thus, recombination of holes H injected from body region 13 into drift region 12 with electrons E injected from drain electrode 50 into drift region 12 can be suppressed. Consequently, occurrence of a stacking fault resulting from recombination can be suppressed. In SiC semiconductor device 1, a concentration of $Z_{1/2}$ center in drift region 12 is not higher than $1 \times 10^{15}$ cm$^{-3}$. Therefore, influence by the $Z_{1/2}$ center onto electrons which pass through drift region 12 is less, and consequently lowering in electrical characteristics due to introduction of the $Z_{1/2}$ center can be suppressed. Therefore, SiC semiconductor device 1 can achieve suppression of increase in on resistance while electrical characteristics thereof are maintained.

Here, "main carriers which pass through the first conductivity type region and migrate between the first electrode and the second electrode being only carriers having the first conductivity type" means that carriers which substantially contribute to electrical conduction between the first electrode and the second electrode through the first conductivity type region are only carriers having the first conductivity type. The "$Z_{1/2}$ center" refers to a deep level resulting from vacancies of carbon (C) atoms forming SiC, which will be described in detail in a specific example of the present embodiment which will be described later.

(2) In the silicon carbide semiconductor device (SiC semiconductor device 1), in the first conductivity type region (drift region 12), a concentration of an impurity having the first conductivity type (n-type) may be higher than a concentration of the $Z_{1/2}$ center.

Thus, influence by the $Z_{1/2}$ center onto electrons which pass through drift region 12 can further be lessened. Consequently, lowering in electrical characteristics due to introduction of the $Z_{1/2}$ center can more reliably be suppressed.

(3) In the silicon carbide semiconductor device (SiC semiconductor device 1), lifetime of carriers (holes H) having a second conductivity type injected from the second conductivity type region (body region 13) into the first conductivity type region (drift region 12) may be not longer than 1 μs.

Thus, recombination of holes H injected from body region 13 into drift region 12 with electrons E injected from the electrode into drift region 12 can more reliably be suppressed. Consequently, occurrence of a stacking fault in a crystal can more reliably be suppressed. "Lifetime of carriers having the second conductivity type" can be determined with a method described in the specific example of the present embodiment which will be described later.

(4) The silicon carbide semiconductor device (SiC semiconductor device 1) may further include a gate insulating film (20) formed on the second conductivity type region (body region 13) and a gate electrode (30) formed on the gate insulating film. In the silicon carbide semiconductor device, migration of the carriers having the first conductivity type (n-type) may be controlled by controlling formation of an inversion layer in the second conductivity type region by applying a voltage to the gate electrode.

For a MOSFET having the construction above, SiC semiconductor device 1 capable of achieving suppression of increase in on resistance while electrical characteristics thereof are maintained can suitably be employed.

(5) A method of manufacturing a silicon carbide (SiC) semiconductor device according to the present embodiment includes the steps of forming a silicon carbide layer (SiC layer 11) including a first conductivity type region (drift region 12) forming one surface (11B) and a second conductivity type region (body region 13) forming a part of the other surface (11A) opposite to the one surface and being in contact with the first conductivity type region, introducing $Z_{1/2}$ center into the first conductivity type region at a concentration not lower than $1\times10^{13}$ cm$^{-3}$ and not higher than $1\times10^{15}$ cm$^{-3}$, forming a first electrode (drain electrode 50) electrically connected to a region on a side of the one surface in the first conductivity type region, and forming a second electrode (source electrode 40) electrically connected to the second conductivity type region. Main carriers which pass through the first conductivity type region and migrate between the first electrode and the second electrode are only carriers having a first conductivity type (n-type).

In the method of manufacturing a silicon carbide semiconductor device, $Z_{1/2}$ center is introduced into drift region 12 at a concentration not lower than $1\times10^{13}$ cm$^{-3}$. Therefore, holes H injected from body region 13 into drift region 12 can be recombined with electrons present within drift region 12 at the $Z_{1/2}$ center before holes reach a region on a side of the electrode in drift region 12. Thus, recombination of holes H injected from body region 13 into drift region 12 with electrons E injected from the electrode into drift region 12 can be suppressed. Consequently, occurrence of a stacking fault resulting from recombination can be suppressed. In the method of manufacturing a silicon carbide semiconductor device, $Z_{1/2}$ center is introduced into drift region 12 at a concentration not higher than $1\times10^{15}$ cm$^{-3}$. Therefore, influence by the $Z_{1/2}$ center onto electrons which pass through drift region 12 is less, and consequently lowering in electrical characteristics due to introduction of the $Z_{1/2}$ center can be suppressed. Therefore, the method of manufacturing a silicon carbide semiconductor device can achieve suppression of increase in on resistance while electrical characteristics are maintained.

(6) The method of manufacturing a silicon carbide (SiC) semiconductor device may further include the step of heating the silicon carbide layer (SiC layer 11). The step of introducing $Z_{1/2}$ center may be performed after the step of heating the silicon carbide layer.

Thus, desired carriers can be produced in SiC layer 11. Timing to introduce $Z_{1/2}$ center into drift region 12 can be selected as appropriate, for example, after heating of SiC layer 11.

(7) In the method of manufacturing a silicon carbide (SiC) semiconductor device, in the step of introducing $Z_{1/2}$ center, the $Z_{1/2}$ center is introduced into the first conductivity type region (drift region 12) with at least one method selected from the group consisting of electron beam irradiation, neutron irradiation, and ion implantation.

Thus, various methods can be selected in introducing $Z_{1/2}$ center.

(8) In the method of manufacturing a silicon carbide (SiC) semiconductor device, in the step of introducing $Z_{1/2}$ center, the $Z_{1/2}$ center may be introduced into the first conductivity type region (drift region 12) through electron beam irradiation in which energy of electron beams is not lower than 150 keV and not higher than 200 keV and fluence of electron beams is not lower than $5\times10^{16}$ cm$^{-2}$ and not higher than $4\times10^{17}$ cm$^{-2}$.

Thus, $Z_{1/2}$ center can readily be introduced into drift region 12.

DETAILS OF EMBODIMENTS OF INVENTION OF PRESENT APPLICATION

A specific example of the embodiments of the present invention will now be described with reference to the drawings. In the drawings below, the same or corresponding elements have the same reference characters allotted and description thereof will not be repeated.

First Embodiment

A structure of an SiC semiconductor device according to a first embodiment representing one embodiment of the present invention will initially be described. Referring to FIG. 1, SiC semiconductor device 1 according to the present embodiment is a planar MOSFET, and mainly includes an SiC substrate 10, SiC layer 11, gate insulating film 20, gate electrode 30, source electrode 40 (second electrode), drain electrode 50 (first electrode), an interlayer insulating film 60, a source interconnection 41, and a drain interconnection 51. SiC layer 11 mainly includes drift region 12 (first conductivity type region), body region 13 (second conductivity type region), a source region 14, and a contact region 15.

SiC substrate 10 has the n conductivity type (first conductivity type) by containing such an n-type impurity as nitrogen (N). Drift region 12 is formed on one surface 10A of SiC substrate 10. Drift region 12 forms one surface 11B of SiC layer 11. Drift region 12 has the n conductivity type by containing such an n-type impurity as nitrogen (N). A concentration of the n-type impurity in drift region 12 is, for example, around $5\times10^{15}$ cm$^{-3}$ and lower than a concentration of the n-type impurity in SiC substrate 10.

Body regions 13 are formed to be a part of surface 11A of SiC layer 11, as being separate from each other in SiC layer 11. Body region 13 is in contact with drift region 12 at a contact surface 12A. Namely, SiC semiconductor device 1 contains a body diode BD formed as a result of contact between drift region 12 having the n conductivity type and body region 13 having the p conductivity type. Body region 13 has the p conductivity type (second conductivity type) by containing such a p-type impurity as aluminum (Al) or boron (B).

Source region 14 is formed in body region 13 so as to include surface 11A. Source region 14 has the n conductivity type by containing such an n-type impurity as phosphorus (P). A concentration of the n-type impurity in source region 14 is higher than a concentration of the n-type impurity in drift region 12.

Contact region 15 is formed in body region 13 so as to include surface 11A and to be adjacent to source region 14. Contact region 15 has the p conductivity type by containing such a p-type impurity as aluminum (Al). A concentration of the p-type impurity in contact region 15 is higher than a concentration of the p-type impurity in body region 13.

$Z_{1/2}$ center is introduced into drift region 12 at a concentration not lower than $1\times10^{13}$ cm$^{-3}$ and not higher than $1\times10^{15}$ cm$^{-3}$. A concentration of the $Z_{1/2}$ center in drift region 12 is preferably not lower than $2.5\times10^{13}$ cm$^{-3}$ and not higher than $7.5\times10^{14}$ cm$^{-3}$ and more preferably not lower than $5.0\times10^{13}$ cm$^{-3}$ and not higher than $5.0\times10^{14}$ cm$^{-3}$. In drift region 12, the concentration of the n-type impurity is higher than the concentration of $Z_{1/2}$ center.

Drift region 12 has a region R1 lying between body region 13 and SiC substrate 10 in a direction of thickness and a region R2 adjacent to region R1 and lying between gate insulating film 20 and SiC substrate 10 in the direction of thickness. In drift region 12, a concentration of the $Z_{1/2}$ center is not lower than $1\times10^{13}$ cm$^{-3}$ at least in region R1 and the concentration of the $Z_{1/2}$ center is not lower than $1\times10^{13}$ cm$^{-3}$ preferably in any of regions R1 and R2 (in the entire drift region 12). In drift region 12, a concentration of the $Z_{1/2}$ center is not higher than $1\times10^{15}$ cm$^{-3}$ at least in region R2 and the concentration of the $Z_{1/2}$ center is not higher than $1\times10^{15}$ cm$^{-3}$ preferably in any of regions R1 and R2 (in the entire drift region 12).

Figure 2:
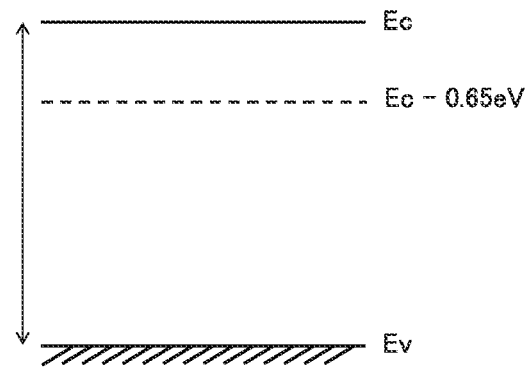
FIG. 2 is a diagram of an energy band of 4H-SiC.

The "$Z_{1/2}$ center" will be described here in detail. FIG. 2 is a diagram of an energy band of 4H-SiC. "Ev" and "Ec" in FIG. 2 represent an upper end of a valence band and a lower end of a conduction band, respectively, and an energy gap between upper end Ev of the valence band and lower end Ec of the conduction band corresponds to a band gap (approximately 3.3 eV) of 4H-SiC. A level lower in energy by 0.65 eV than lower end Ec of the conduction band shown with a dashed line in FIG. 2 corresponds to the $Z_{1/2}$ center. The $Z_{1/2}$ center is a deep level resulting from vacancies of carbon (C) atoms forming SiC, and can be determined, for example, with such a method as deep level transient spectroscopy (DLTS).

Referring to FIG. 1, gate insulating film 20 is formed on surface 11A of SiC layer 11 (on body region 13) as being in contact with the same. Gate insulating film 20 is composed, for example, of silicon dioxide (SiO$_2$), and formed to extend from above one source region 14 to above the other source region 14.

Gate electrode 30 is formed on gate insulating film 20 as being in contact with the same. Gate electrode 30 is composed of a conductor such as polysilicon to which an impurity has been added or aluminum (Al) and formed to extend from above one source region 14 to above the other source region 14.

Source electrode 40 is formed on surface 11A of SiC layer 11 (on source region 14 and contact region 15) as being in contact with the same. Source electrode 40 is composed of a material which can establish ohmic contact with source region 14 such as Ni$_x$Si$_y$ (nickel silicide), Ti$_x$Si$_y$ (titanium silicide), Al$_x$Si$_y$ (aluminum silicide), and Ti$_x$Al$_y$Si$_z$ (titanium aluminum silicide) (x, y, z>0). Source electrode 40 is electrically connected to body region 13 with contact region 15 being interposed.

Drain electrode 50 is formed on surface 10B opposite to surface 10A of SiC substrate 10 as being in contact with the same. Drain electrode 50 is composed, for example, of a material the same as that for source electrode 40. Drain electrode 50 is electrically connected to a region opposite to a side of surface 12A of contact with body region 13 in drift region 12 (a region on a side of surface 11B) with SiC substrate 10 being interposed.

Interlayer insulating film 60 is formed to surround gate electrode 30 together with gate insulating film 20, over surface 11A of SiC layer 11. Interlayer insulating film 60 is composed, for example, of SiO$_2$ and isolates gate electrode 30 from source electrode 40.

Source interconnection 41 is formed to cover source electrode 40 and interlayer insulating film 60. Source interconnection 41 is composed of a metal such as aluminum (Al) or gold (Au), and electrically connected to source region 14 with source electrode 40 being interposed.

Drain interconnection 51 is formed to cover drain electrode 50. Drain interconnection 51 is composed of a metal such as aluminum (Al) or gold (Au) similarly to source interconnection 41, and electrically connected to SiC substrate 10 with drain electrode 50 being interposed.

An operation of SiC semiconductor device 1 according to the present embodiment will now be described. Referring to FIG. 1, when a voltage applied to gate electrode 30 is lower than a threshold voltage, that is, in an off state, a pn junction formed between body region 13 and drift region 12 is reverse biased and is rendered non-conductive even though a voltage is applied across source electrode 40 and drain electrode 50. When a voltage equal to or higher than the threshold voltage is applied to gate electrode 30, an inversion layer is formed in a channel region in body region 13 (body region 13 under gate electrode 30). Then, electrons injected from source electrode 40 pass successively through source region 14, body region 13, drift region 12, and SiC substrate 10, and migrate to drain electrode 50. Thus, SiC semiconductor device 1 operates by controlling migration of electrons between source electrode 40 and drain electrode 50 by controlling formation of the inversion layer in body region 13 based on a voltage applied to gate electrode 30. SiC semiconductor device 1 is a unipolar device (unipolar transistor) in which main carriers which pass through drift region 12 and migrate between source electrode 40 and drain electrode 50 are only electrons.

Figure 3:
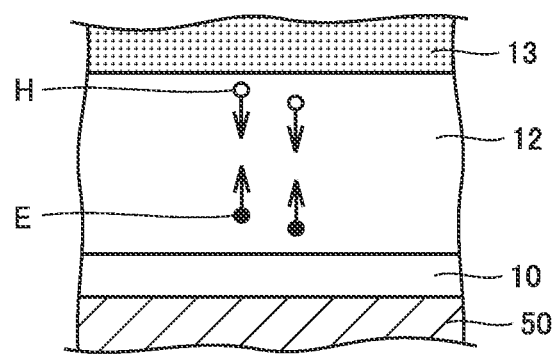
FIG. 3 is an enlarged view schematically showing a structure of a body diode in the silicon carbide semiconductor device according to the first embodiment.

FIG. 3 is an enlarged view of body diode BD formed as a result of contact between n-type drift region 12 and p-type body region 13 in the SiC semiconductor device. During operation of the SiC semiconductor device, electrons migrate between source electrode 40 and drain electrode 50, and as shown in FIG. 3, holes (H) are injected from body region 13 into drift region 12 and electrons E are injected from drain electrode 50 through SiC substrate 10 into drift region 12.

As set forth above, in SiC semiconductor device 1 according to the present embodiment, $Z_{1/2}$ center is introduced into drift region 12 at a concentration not lower than $1\times10^{13}$ cm$^{-3}$. Therefore, holes H injected from body region 13 into drift region 12 can be recombined with electrons present in drift region 12 at the $Z_{1/2}$ center before the holes reach a region on a side of drain electrode 50 in drift region 12. Thus, recombination of holes H injected from body region 13 into drift region 12 with electrons E injected from drain electrode 50 into drift region 12 can be suppressed. Consequently, occurrence of a stacking fault resulting from recombination can be suppressed. In SiC semiconductor device 1, a concentration of the $Z_{1/2}$ center in drift region 12 is not higher than $1\times10^{15}$ cm$^{-3}$. Thus, influence by the $Z_{1/2}$ center onto electrons which pass through drift region 12 during operation is lessened, and consequently, lowering in electrical characteristics due to introduction of the $Z_{1/2}$ center can be suppressed. Therefore, SiC semiconductor device 1 can achieve suppression of increase in on resistance while electrical characteristics thereof are maintained.

In SiC semiconductor device 1, in drift region 12, a concentration of an n-type impurity may be higher than a concentration of the $Z_{1/2}$ center. Thus, influence by the $Z_{1/2}$ center onto electrons which pass through drift region 12 during operation can further be lessened. Consequently, lowering in electrical characteristics due to introduction of the $Z_{1/2}$ center can more reliably be suppressed.

In SiC semiconductor device 1, lifetime of holes H injected from body region 13 into drift region 12 may be not longer than 1 µs. Thus, recombination of holes H injected from body region 13 into drift region 12 with electrons E injected from drain electrode 50 into drift region 12 can more reliably be suppressed. Consequently, occurrence of a stacking fault in a crystal can more reliably be suppressed.

Figure 4:
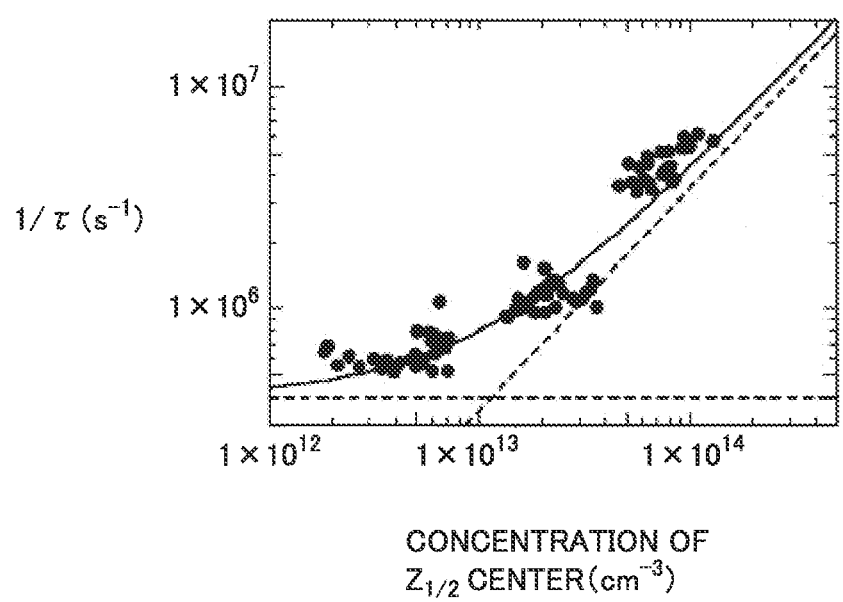
FIG. 4 is a graph showing relation between a concentration of $Z_{1/2}$ center and a reciprocal of lifetime of carriers.

Lifetime of holes H injected from body region 13 into drift region 12 can be determined with a microwave photoconductivity decay (μ-PCD) method as in Katsunori Danno, Daisuke Nakamura, and Tsunenobu Kimoto, "Investigation of carrier lifetime in 4H-SiC epilayers and lifetime control by electron irradiation," Applied Physics Letters, (United States), AIP Publishing LLC, May 17, 2007, Vol. 90, 202109 (1 to 3) (NPD 2). FIG. 4 is a graph showing relation between a concentration of $Z_{1/2}$ center (abscissa: $cm^{-3}$) in an epitaxially grown layer composed of 4H-SiC and a reciprocal ($1/\tau$) (ordinate: $s^{-1}$) of lifetime in NPD 2. As is clear from FIG. 4, when a concentration of $Z_{1/2}$ center is not lower than $1\times10^{13}$ $cm^{-3}$, lifetime ($\tau$) of carriers is not longer than 1 μs. As lifetime of the carriers is thus short, in a MOSFET as in the present embodiment, occurrence of a stacking fault resulting from recombination of carriers is suppressed, and consequently increase in on resistance can be suppressed.

Figure 5:
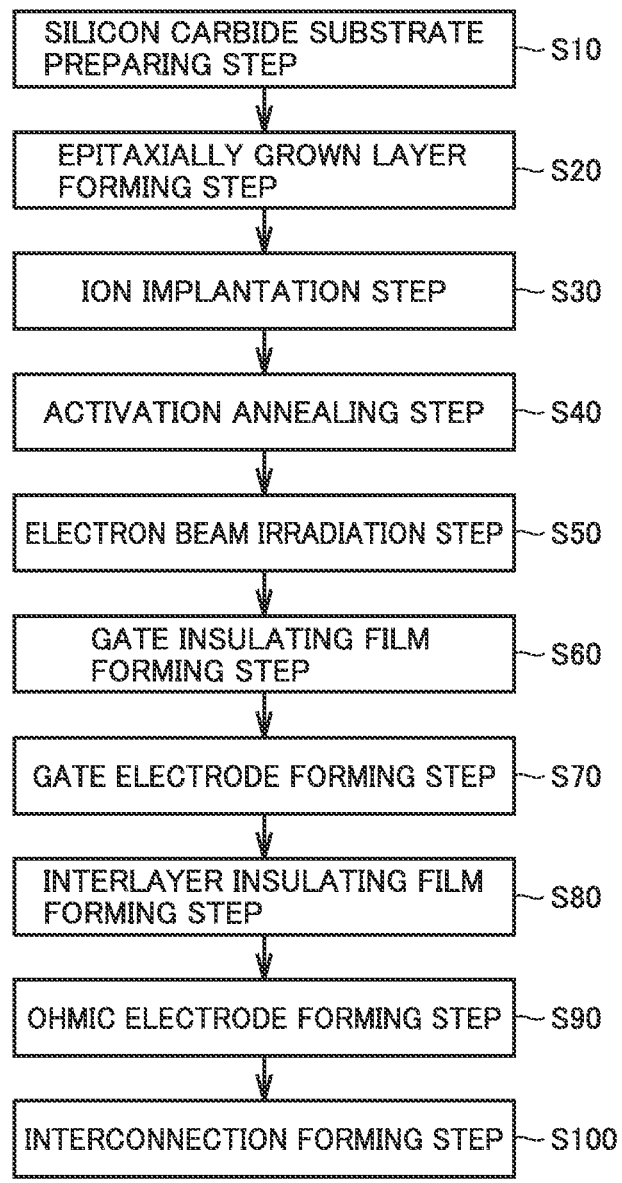
FIG. 5 is a flowchart schematically showing a method of manufacturing a silicon carbide semiconductor device according to the first embodiment.
Figure 6:
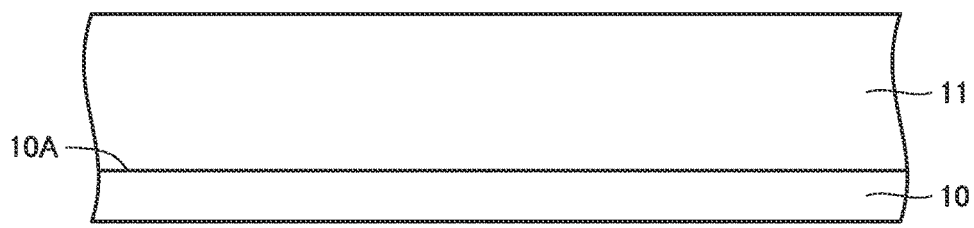
FIG. 6 is a schematic diagram for illustrating steps (S10) and (S20) in the method of manufacturing a silicon carbide semiconductor device according to the first embodiment.

A method of manufacturing an SiC semiconductor device according to the present embodiment will now be described. Referring to FIG. 5, in the method of manufacturing an SiC semiconductor device, initially, a silicon carbide substrate preparing step is performed in a step (S10). In this step (S10), referring to FIG. 6, SiC substrate 10 is prepared, for example, by cutting an ingot (not shown) composed of 4H-SiC.

Then, in a step (S20), an epitaxially grown layer forming step is performed. In this step (S20), referring to FIG. 6, SiC layer 11 is formed on surface 10A of SiC substrate 10 through epitaxial growth. SiC layer 11 has a thickness, for example, not smaller than 10 μm and not greater than 100 μm.

Figure 7:
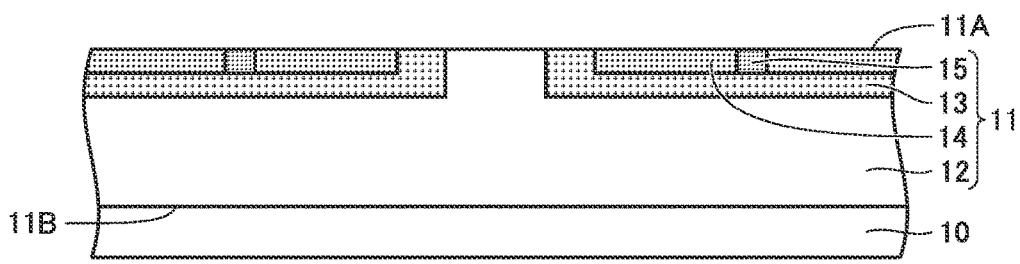
FIG. 7 is a schematic diagram for illustrating steps (S30) and (S40) in the method of manufacturing a silicon carbide semiconductor device according to the first embodiment.

Then, in a step (S30), an ion implantation step is performed. In this step (S30), referring to FIG. 7, initially, body region 13 (the second conductivity type region) is formed in SiC layer 11, for example, as aluminum (Al) ions are implanted into SiC layer 11. Then, source region 14 is formed in body region 13, for example, as phosphorus (P) ions are implanted into body region 13. Then, contact region 15 is formed in body region 13 to be adjacent to source region 14, for example, as aluminum (Al) ions are implanted into body region 13. Then, a region where none of body region 13, source region 14, and contact region 15 is formed in SiC layer 11 is drift region 12 (the first conductivity type region). Thus, SiC layer 11 including drift region 12 forming surface 11B and body region 13 forming a part of surface 11A and being in contact with drift region 12 is formed.

Then, in a step (S40), an activation annealing step is performed. In this step (S40), referring to FIG. 7, an impurity introduced into SiC layer 11 is activated as SiC substrate 10 on which SiC layer 11 is formed is heated. Thus, desired carriers are produced in the impurity regions in SiC layer 11.

Figure 8:
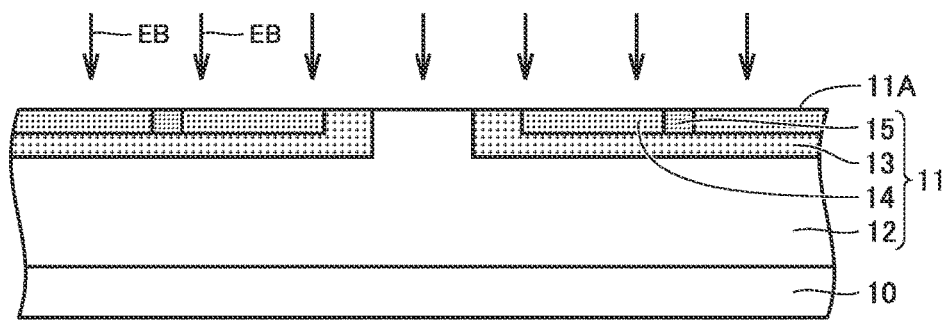
FIG. 8 is a schematic diagram for illustrating a step (S50) in the method of manufacturing a silicon carbide semiconductor device according to the first embodiment.

Then, in a step (S50), an electron beam irradiation step is performed. In this step (S50), referring to FIG. 8, electron beams EB are emitted to SiC layer 11 from a side of surface 11A. Thus, $Z_{1/2}$ center is formed in drift region 12 at a concentration not lower than $1\times10^{13}$ $cm^{-3}$ and not higher than $1\times10^{15}$ $cm^{-3}$.

Energy of electron beams EB can be selected as appropriate depending on a thickness of SiC layer 11, and it is, for example, not lower than 100 keV and not higher than 250 keV and preferably not lower than 150 keV and not higher than 200 keV. Fluence of electron beams EB can be selected as appropriate depending on a concentration of $Z_{1/2}$ center to be introduced, and it is, for example, not lower than $1\times10^{16}$ $cm^{-2}$ and not higher than $8\times10^{17}$ $cm^{-2}$ and preferably not lower than $5\times10^{16}$ $cm^{-2}$ and not higher than $4\times10^{17}$ $cm^{-2}$.

The $Z_{1/2}$ center can also be formed, for example, with such a method as neutron irradiation or ion implantation, without being limited to formation through electron beam irradiation. The $Z_{1/2}$ center may be formed by combining methods of electron beam irradiation, neutron irradiation, and ion implantation as appropriate.

Figure 9:
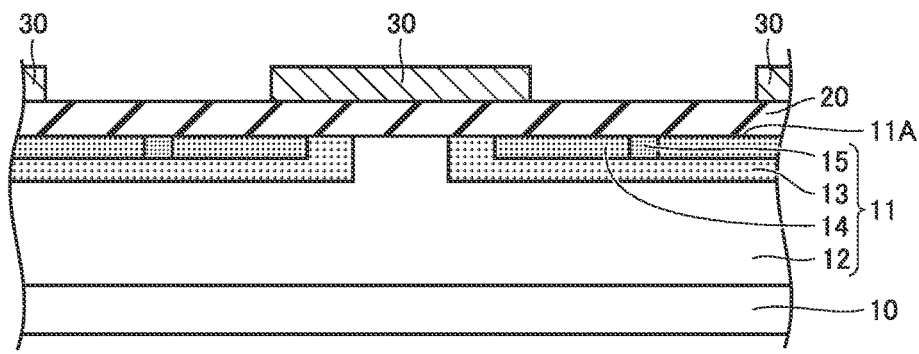
FIG. 9 is a schematic diagram for illustrating steps (S60) and (S70) in the method of manufacturing a silicon carbide semiconductor device according to the first embodiment.

Then, in a step (S60), a gate insulating film forming step is performed. In this step (S60), referring to FIG. 9, gate insulating film 20 composed of silicon dioxide ($SiO_2$) is formed on surface 11A, for example, by heating SiC substrate 10 having SiC layer 11 formed in an atmosphere containing oxygen ($O_2$).

Then, in a step (S70), a gate electrode forming step is performed. In this step (S70), referring to FIG. 9, gate electrode 30 being in contact with gate insulating film 20 and composed of polysilicon is formed, for example, through low pressure chemical vapor deposition (LPCVD).

Figure 10:
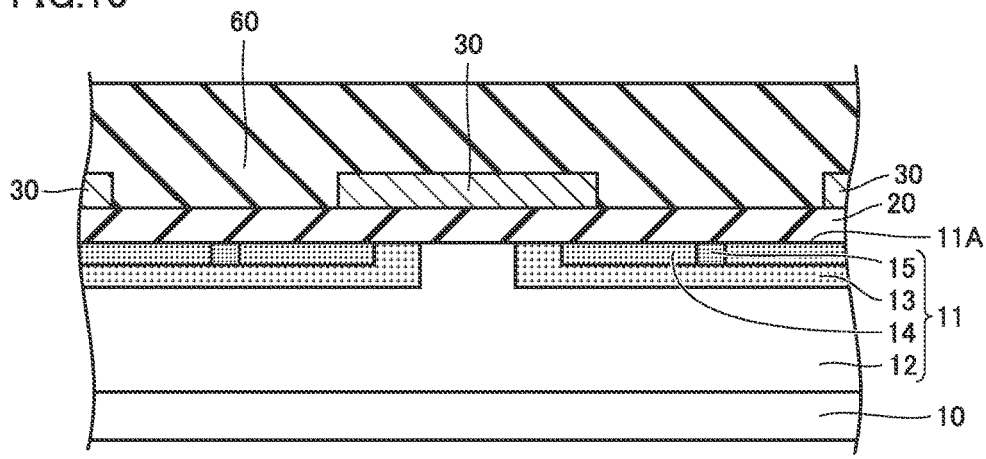
FIG. 10 is a schematic diagram for illustrating a step (S80) in the method of manufacturing a silicon carbide semiconductor device according to the first embodiment.

Then, in a step (S80), an interlayer insulating film forming step is performed. In this step (S80), referring to FIG. 10, interlayer insulating film 60 composed of $SiO_2$ is formed to surround gate electrode 30 together with gate insulating film 20, for example, with CVD.

Figure 11:
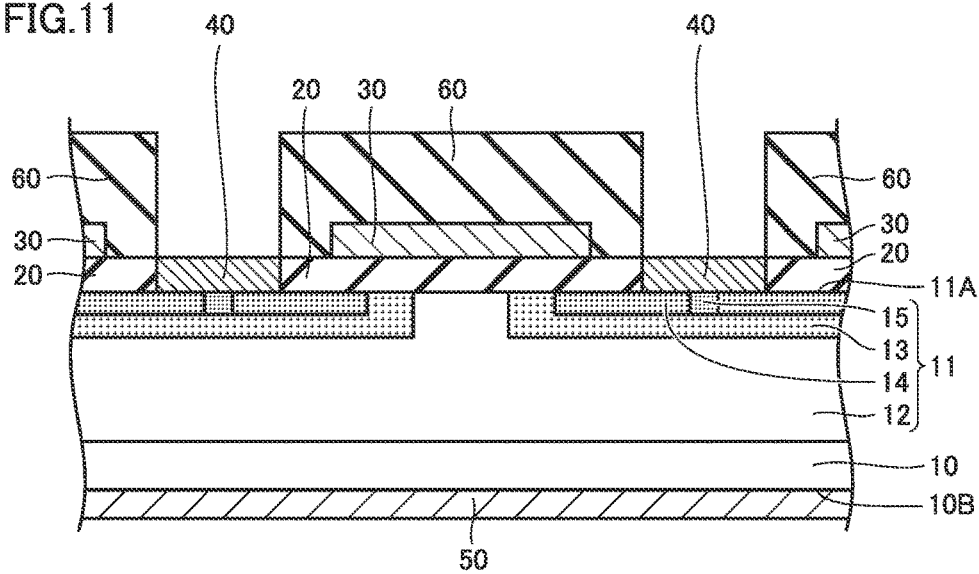
FIG. 11 is a schematic diagram for illustrating a step (S90) in the method of manufacturing a silicon carbide semiconductor device according to the first embodiment.

Then, in a step (S90), an ohmic electrode forming step is performed. In this step (S90), referring to FIG. 11, initially, gate insulating film 20 and interlayer insulating film 60 are etched away in a region where source electrode 40 is to be formed. Thus, a region where source region 14 and contact region 15 are exposed is formed. Then, in that region, a film composed, for example, of nickel (Ni) is formed. A film composed, for example, of Ni is formed on surface 10B of SiC substrate 10. Thereafter, at least a part of the film composed of Ni is silicided as SiC substrate 10 is heated. Thus, source electrode 40 and drain electrode 50 are formed on surface 11A of SiC layer 11 and surface 10B of SiC substrate 10, respectively.

Then, in a step (S100), an interconnection forming step is performed. In this step (S100), referring to FIG. 1, source interconnection 41 composed of a conductor such as aluminum (Al) or gold (Au) is formed to cover source electrode 40 and interlayer insulating film 60, for example, through vapor deposition. Drain interconnection 51 composed of aluminum (Al) or gold (Au) similarly to source interconnection 41 is formed to cover drain electrode 50. As the steps (S10) to (S100) are performed, SiC semiconductor device 1 is manufactured and the method of manufacturing an SiC semiconductor device according to the present embodiment is completed.

As set forth above, in the method of manufacturing an SiC semiconductor device according to the present embodiment, SiC semiconductor device 1 can be manufactured by introducing $Z_{1/2}$ center into drift region 12 through electron beam irradiation in the step (50) at a concentration not lower than $1\times10^{13}$ $cm^{-3}$ and not higher than $1\times10^{15}$ $cm^{-3}$. Therefore, according to the method of manufacturing an SiC semiconductor device, an SiC semiconductor device of which electrical characteristics are maintained and increase in on resistance is suppressed can be manufactured.

Second Embodiment

A second embodiment representing another embodiment of the present invention will now be described. A method of manufacturing an SiC semiconductor device according to the present embodiment is basically performed similarly to the method of manufacturing an SiC semiconductor device in the first embodiment and achieves similar effects. The method of manufacturing an SiC semiconductor device according to the present embodiment, however, is different from the first embodiment in timing of introduction of $Z_{1/2}$ center into the drift region.

Figure 12:
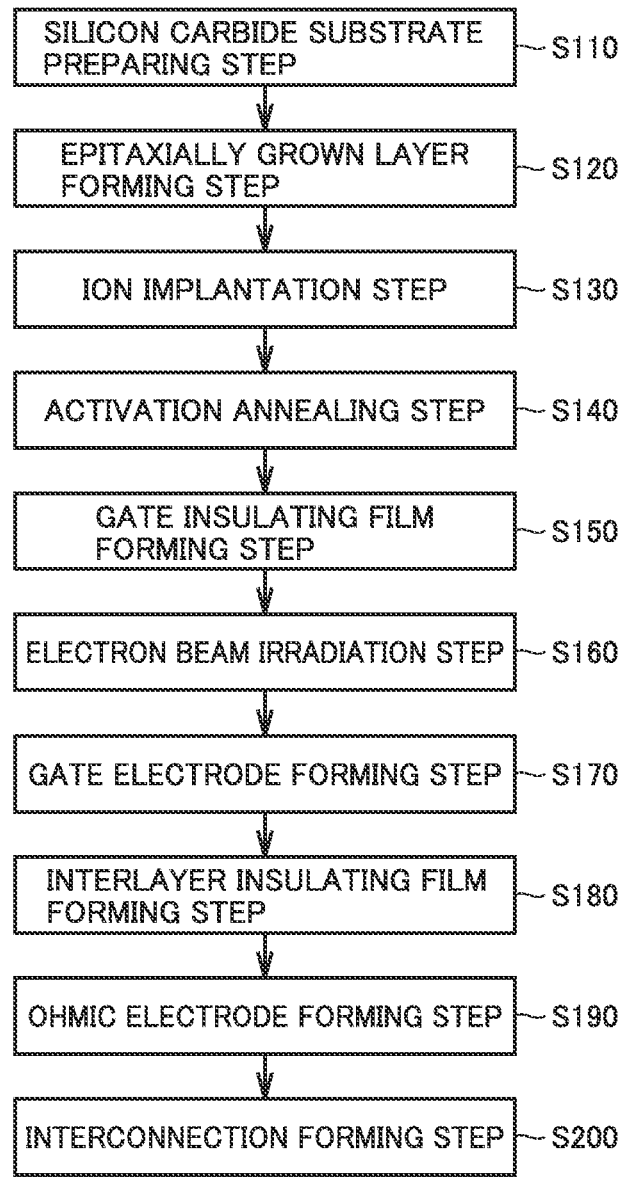
FIG. 12 is a flowchart schematically showing a method of manufacturing a silicon carbide semiconductor device according to a second embodiment.
Figure 13:
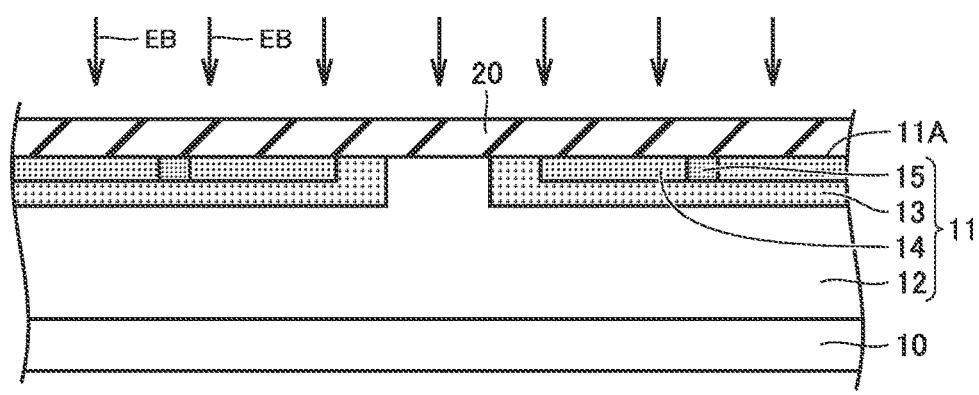
FIG. 13 is a schematic diagram for illustrating the method of manufacturing a silicon carbide semiconductor device according to the second embodiment.

Referring to FIG. 12, in the method of manufacturing an SiC semiconductor device according to the present embodiment, initially, steps (S110) to (S150) are performed in a procedure the same as in the steps (S10) to (S40) and (S60) in the first embodiment. Thus, SiC layer 11 including impurity regions is formed on SiC substrate 10 and gate insulating film 20 is formed on surface 11A of SiC layer 11 as shown in FIG. 13.

Then, in a step (S160), an electron beam irradiation step is performed. In this step (S160), referring to FIG. 13, electron beams EB are emitted from the side of surface 11A to SiC layer 11 having gate insulating film 20 formed, through a procedure the same as in the step (S50) in the first embodiment. $Z_{1/2}$ center is thus introduced into drift region 12 at the concentration above.

Then, steps (S170) to (S200) are performed in a procedure the same as in (S70) to (S100) in the first embodiment. Thus, SiC semiconductor device 1 (see FIG. 1) of which electrical characteristics are maintained and increase in on resistance is suppressed can be manufactured as in the first embodiment.

Third Embodiment

A third embodiment representing yet another embodiment of the present invention will now be described. A method of manufacturing an SiC semiconductor device according to the present embodiment is basically performed similarly to the method of manufacturing an SiC semiconductor device in the first embodiment and achieves similar effects. The method of manufacturing an SiC semiconductor device according to the present embodiment, however, is different from the first embodiment in timing of introduction of $Z_{1/2}$ center into the drift region.

Figure 14:
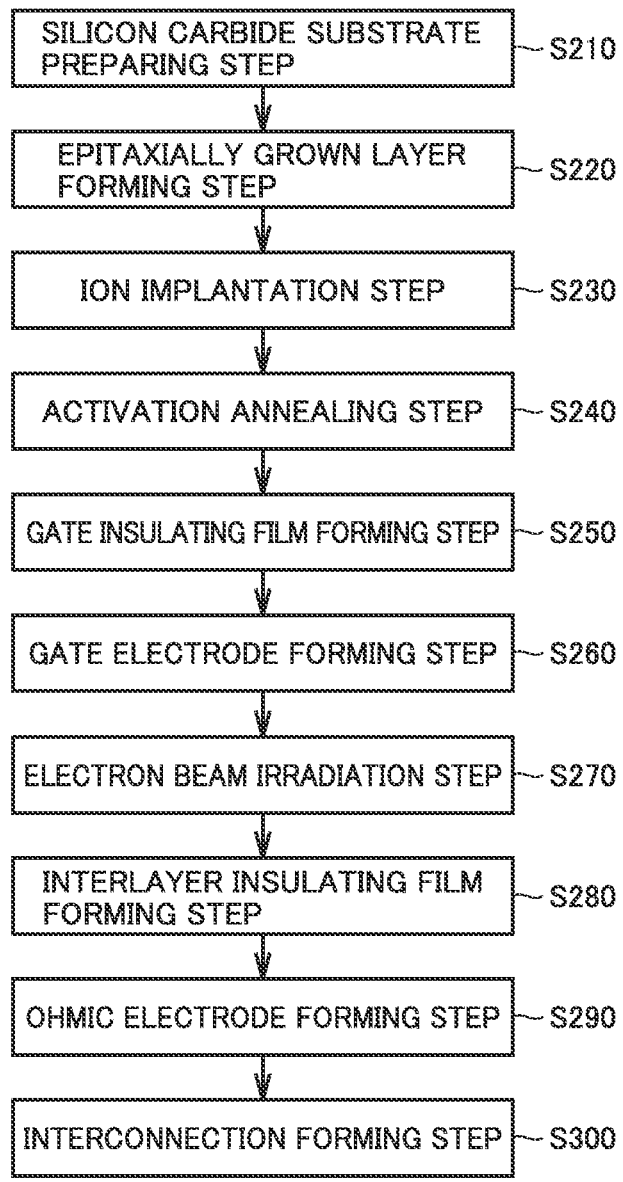
FIG. 14 is a flowchart schematically showing a method of manufacturing a silicon carbide semiconductor device according to a third embodiment.
Figure 15:
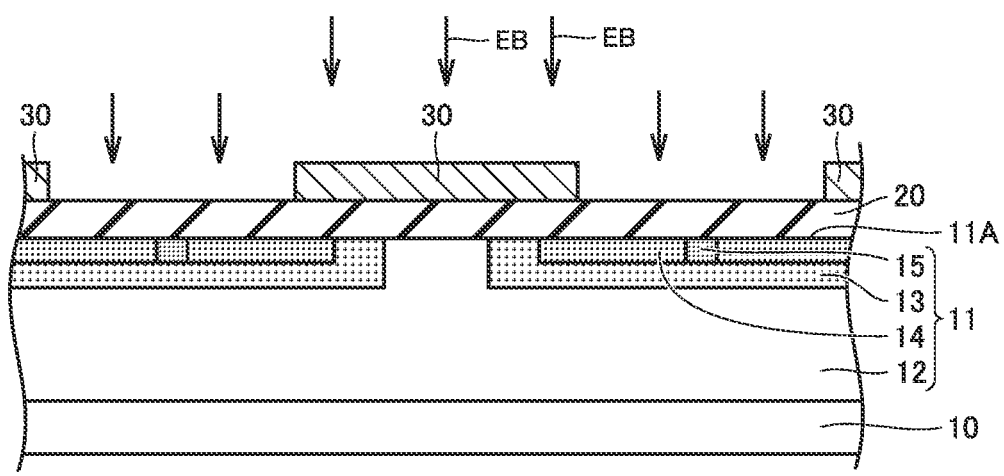
FIG. 15 is a schematic diagram for illustrating the method of manufacturing a silicon carbide semiconductor device according to the third embodiment.

Referring to FIG. 14, in the method of manufacturing an SiC semiconductor device according to the present embodiment, initially, steps (S210) to (S260) are performed in a procedure the same as in the steps (S10) to (S40) and (S60) and (S70) in the first embodiment. Thus, SiC layer 11 including impurity regions is formed on SiC substrate 10, gate insulating film 20 is formed on surface 11A of SiC layer 11, and gate electrode 30 is formed on gate insulating film 20 as shown in FIG. 15.

Then, in a step (S270), an electron beam irradiation step is performed. In this step (S270), referring to FIG. 15, electron beams EB are emitted from the side of surface 11A to SiC layer 11 having gate insulating film 20 and gate electrode 30 formed, through a procedure the same as in the step (S50) in the first embodiment. $Z_{1/2}$ center is thus introduced into drift region 12 at the concentration above.

Then, steps (S280) to (S300) are performed in a procedure the same as in (S80) to (S100) in the first embodiment. Thus, SiC semiconductor device 1 (see FIG. 1) of which electrical characteristics are maintained and increase in on resistance is suppressed can be manufactured as in the first embodiment.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The silicon carbide semiconductor device and the method of manufacturing the same according to the present invention are particularly advantageously applicable to a silicon carbide semiconductor device required to achieve suppression of increase in on resistance while electrical characteristics thereof are maintained and a method of manufacturing the same.

REFERENCE SIGNS LIST 1 silicon carbide (SiC) semiconductor device; 10 silicon carbide (SiC) substrate; 10A, 10B, 11A surface; 11 silicon carbide (SiC) layer; 12 drift region; 12A contact surface; 13 body region; 14 source region; 15 contact region; 20 gate insulating film; 30 gate electrode; 40 source electrode; 41 source interconnection; 50 drain electrode; 51 drain interconnection; 60 interlayer insulating film; BD body diode; E electron; EB electron beam; Ec lower end; Ev upper end; H hole; and R1, R2 region.

The invention claimed is:

1. A method of manufacturing a silicon carbide semiconductor device, comprising the steps of:
forming a silicon carbide layer including a first conductivity type region forming one surface and a second conductivity type region forming a part of the other surface opposite to the one surface and being in contact with the first conductivity type region;
heating the silicon carbide layer;
introducing $Z_{1/2}$ center into the first conductivity type region at a concentration not lower than $1 \times 10^{13}$ cm$^{-3}$ and not higher than $1 \times 10^{15}$ cm$^{-3}$, the step of introducing $Z_{1/2}$ center is performed after the step of heating the silicon carbide layer;
forming a first electrode electrically connected to a region on a side of the one surface in the first conductivity type region; and
forming a second electrode electrically connected to the second conductivity type region,
main carriers which pass through the first conductivity type region and migrate between the first electrode and the second electrode being only carriers having a first conductivity type,
wherein lifetime of carriers having a second conductivity type injected from the second conductivity type region into the first conductivity type region is not longer than 1 µs.

2. The method of manufacturing a silicon carbide semiconductor device according to claim 1, wherein
in the step of introducing $Z_{1/2}$ center, the $Z_{1/2}$ center is introduced into the first conductivity type region with at least one method selected from the group consisting of electron beam irradiation, neutron irradiation, and ion implantation.

3. The method of manufacturing a silicon carbide semiconductor device according to claim 2, wherein
in the step of introducing $Z_{1/2}$ center, the $Z_{1/2}$ center is introduced into the first conductivity type region through the electron beam irradiation in which energy of electron beams is not lower than 150 keV and not higher than 200 keV and fluence of electron beams is not lower than $5 \times 10^{16}$ cm$^{-2}$ and not higher than $4 \times 10^{17}$ cm$^{-2}$.

4. A method of manufacturing a silicon carbide semiconductor device, comprising the steps of:
- forming a silicon carbide layer including a first conductivity type region forming one surface and a second conductivity type region forming a part of the other surface opposite to the one surface and being in contact with the first conductivity type region;
- heating the silicon carbide layer;
- introducing Z1/2 center into the first conductivity type region at a concentration not lower than $1\times10^{13}$ cm$^{-3}$ and not higher than $1\times10^{15}$ cm$^{-3}$, the step of introducing Z1/2 center is performed after the step of heating the silicon carbide layer;
- forming a first electrode electrically connected to a region on a side of the one surface in the first conductivity type region; and
- forming a second electrode electrically connected to the second conductivity type region, main carriers which pass through the first conductivity type region and migrate between the first electrode and the second electrode being only carriers having a first conductivity type.

5. The method of manufacturing a silicon carbide semiconductor device according to claim 4, wherein
in the step of introducing $Z_{1/2}$ center, the $Z_{1/2}$ center is introduced into the first conductivity type region with at least one method selected from the group consisting of electron beam irradiation, neutron irradiation, and ion implantation.

6. The method of manufacturing a silicon carbide semiconductor device according to claim 5, wherein
in the step of introducing $Z_{1/2}$ center, the $Z_{1/2}$ center is introduced into the first conductivity type region through the electron beam irradiation in which energy of electron beams is not lower than 150 keV and not higher than 200 keV and fluence of electron beams is not lower than $5\times10^{16}$ cm$^{-2}$ and not higher than $4\times10^{17}$ cm$^{-2}$.

* * * * *